United States Patent
Li et al.

(10) Patent No.: US 11,950,371 B2
(45) Date of Patent: Apr. 2, 2024

(54) METHOD FOR MANUFACTURING TRANSPARENT CIRCUIT BOARD

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Cheng-Jia Li, Qinhuangdao (CN); Mei Yang, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 740 days.

(21) Appl. No.: 16/966,118

(22) PCT Filed: Aug. 22, 2019

(86) PCT No.: PCT/CN2019/101923
§ 371 (c)(1),
(2) Date: Jul. 30, 2020

(87) PCT Pub. No.: WO2021/031183
PCT Pub. Date: Feb. 25, 2021

(65) Prior Publication Data
US 2023/0089856 A1    Mar. 23, 2023

(51) Int. Cl.
*H05K 3/00* (2006.01)
*H05K 3/10* (2006.01)
(Continued)

(52) U.S. Cl.
CPC ......... *H05K 3/0097* (2013.01); *H05K 3/0026* (2013.01); *H05K 3/465* (2013.01);
(Continued)

(58) Field of Classification Search
CPC ...... H05K 3/0097; H05K 3/465; H05K 3/107; H05K 2201/0108; H05K 2203/0152;
(Continued)

(56) References Cited

U.S. PATENT DOCUMENTS

| | | | | |
|---|---|---|---|---|
| 4,751,126 A | * | 6/1988 | Oodaira | H05K 2203/1572 156/298 |
| 5,199,163 A | * | 4/1993 | Ehrenberg | H05K 2203/0152 216/33 |

(Continued)

FOREIGN PATENT DOCUMENTS

| | | |
|---|---|---|
| CN | 102215640 A | 10/2011 |
| CN | 104244614 A | 12/2014 |

(Continued)

OTHER PUBLICATIONS

English Translation CN108156763 (Year: 2018).*
(Continued)

*Primary Examiner* — A. Dexter Tugbang
(74) *Attorney, Agent, or Firm* — ScienBiziP, P.C.

(57) ABSTRACT

A method for manufacturing a transparent circuit board includes the following steps. A composite substrate including a conductive layer and a transparent insulating layer on the conductive layer is provided. A wiring groove is formed on the transparent insulating layer by laser ablation and a carbon black layer is formed on an inner wall of the wiring groove. The wiring groove penetrates the transparent insulating layer, the wiring groove extends toward the conductive layer to pass through a part of the conductive layer. A conductive wiring corresponding to the wiring groove is formed and fully fills the wiring groove. A black oxide treatment is performed on a surface of the conductive wiring facing away from the conductive layer to form a blackened layer. A transparent cover film is pressed on a side of the (Continued)

transparent insulating layer facing away from the conductive layer. The conductive layer is removed.

5 Claims, 4 Drawing Sheets

(51) Int. Cl.
*H05K 3/46* (2006.01)
*H05K 3/38* (2006.01)
*H05K 3/40* (2006.01)

(52) U.S. Cl.
CPC ............ *H05K 3/107* (2013.01); *H05K 3/385* (2013.01); *H05K 3/4038* (2013.01); *H05K 3/4053* (2013.01); *H05K 3/4076* (2013.01); *H05K 2201/0108* (2013.01); *H05K 2201/0323* (2013.01); *H05K 2203/0152* (2013.01); *H05K 2203/1572* (2013.01)

(58) Field of Classification Search
CPC .. H05K 3/4038; H05K 3/4053; H05K 3/4076; H05K 3/385; H05K 2203/1572; H05K 3/0026; H05K 2201/1572
See application file for complete search history.

(56) References Cited

U.S. PATENT DOCUMENTS

| | | | |
|---|---|---|---|
| 9,832,868 B1 * | 11/2017 | Wright | ................ H05K 3/4038 |
| 2012/0298413 A1 * | 11/2012 | Mori | .............. H05K 2203/0152 |
| | | | 29/829 |
| 2013/0068510 A1 * | 3/2013 | Kwon | .................. H05K 3/4038 |
| | | | 216/17 |
| 2014/0374153 A1 | 12/2014 | Lee et al. | |

FOREIGN PATENT DOCUMENTS

| | | |
|---|---|---|
| CN | 105407648 A | 3/2016 |
| CN | 105491796 A | 4/2016 |
| CN | 108156763 A | 6/2018 |
| JP | 2016092052 A * | 5/2016 |

OTHER PUBLICATIONS

English Translation JP2013235315 (Year: 2013).*
Sukumaran et al., "Low-Cost Thin Glass Interposers as a Superior Alternative to Silicon and Organic Interposers for Packaging of 3-D ICs," in IEEE Transactions on Components, Packaging and Manufacturing Technology, vol. 2, No. 9, pp. 1426-1433, Sep. 2012. (Year: 2012).*

* cited by examiner

METHOD FOR MANUFACTURING TRANSPARENT CIRCUIT BOARD

FIELD

The subject matter herein generally relates to a field of circuit boards, especially to a transparent circuit board and a method for manufacturing the same.

BACKGROUND

Transparent circuit boards, a hot topic in the industry, have been used in mobile phones, automotive transparent boards, and other electronic products. Current transparent circuit boards generally use transparent materials in combination with thin lines and large line spacing to achieve a transparent visual effect. However, since the circuit needs to carry a certain amount of current, it has limitations on the design of the line width. Therefore, how to further improve the transparency of the transparent circuit board is the next challenge.

SUMMARY

What is needed, is a method for manufacturing a transparent circuit board to improve transparency.

What is also needed, is a transparent circuit board.

A method for manufacturing a transparent circuit board includes the following steps:

providing a composite substrate, the composite substrate including a conductive layer and a transparent insulating layer disposed on the conductive layer;

forming a wiring groove on the transparent insulating layer by laser ablation, and forming a carbon black layer on an inner wall of the wiring groove, wherein the wiring groove penetrates the transparent insulating layer;

forming a conductive wiring corresponding to the wiring groove, the conductive wiring fully filling the wiring groove;

performing a black oxide treatment on a surface of the conductive wiring facing away from the conductive layer to form a blackened layer;

pressing a transparent cover film on a side of the transparent insulating layer facing away from the conductive layer; and removing the conductive layer.

Further, the conductive layer is a nickel plate.

Further, the step of "forming the wiring groove on the transparent insulating layer by laser ablation, and forming the carbon black layer on the inner wall of the wiring groove, wherein the wiring groove penetrates the transparent insulating layer" further comprises:

the wiring groove extends toward the conductive layer to pass through a part of the conductive layer.

Further, a surface roughness of the blackened layer is greater than a surface roughness of the carbon black layer.

Further, the composite substrate comprises two transparent insulating layers on opposite surfaces of the conductive layer.

Further, a line width of the conductive wiring is less than 8 μm, and a thickness of the conductive wiring is greater than 10 μm.

A transparent circuit board includes a conductive wiring, a transparent insulating layer, and a cover film. The transparent insulating layer and the cover film are stacked along a stacking direction. The conductive wiring penetrates the transparent insulating layer along the stacking direction, and is at least partially embedded in the transparent insulating layer. A blackened layer is formed on a surface of the conductive wiring combined with the cover film. A carbon black layer is formed on a surface of the conductive wiring without the blackened layer.

Further, the conductive wiring protrudes from a side of the transparent insulating layer facing away from the cover film.

Further, a surface roughness of the blackened layer is greater than a surface roughness of the carbon black layer.

Further, a line width of the conductive wiring is less than 8 μm, and a thickness of the conductive wiring is greater than 10 μm.

The whole surface of the conductive wiring of the transparent circuit board made by the present invention of the method for manufacturing the transparent circuit board is covered by the carbon black layer and the blackened layer, which reduces a reflection of light by the conductive wiring, so that a transparency of the transparent circuit board increases. At the same time, the carbon black layer and the blackened layer may prevent the conductive wiring from being oxidized, thereby ensuring a quality of the conductive wiring. Moreover, since the conductive wiring is at least partially embedded in the transparent insulating layer, a line width of the conductive wiring is reduced while thickening, so that a larger current may be carried without increasing an overall thickness of the transparent circuit board. That is, the wirings may be designed thinner, thereby further improving the transparency of the transparent circuit board. Further, since the surface roughness of the blackened layer is relatively great, a bonding force between the blackened layer and the cover film is increased. Further, the use of a nickel plate as the conductive layer may provide a carrier for conducting current when the conductive wiring is formed by electroplating, and a surface of the nickel plate is relatively smooth, the conductive layer can be easily removed, thereby improving production efficiency and product quality.

BRIEF DESCRIPTION OF THE DRAWINGS

Implementations of the present disclosure will now be described, by way of embodiments, with reference to the attached figures.

Description of symbols for main elements: 10 represents a composite substrate, 11 represents a first transparent insulating layer, 13 represents a conductive layer, 15 represents a second transparent insulating layer, 17 represents a wiring groove, 18 represents a carbon black layer, 30 represents a conductive wiring, 40 represents a blackened layer, 50 represents a transparent cover film, 51 represents an adhesive layer, 53 represents a protective layer, 100 represents a transparent circuit board, 60 represents a gold layer, 70 represents an electronic component, 12 represents a transparent insulating layer.

Implementations of the disclosure will now be described, with reference to the drawings.

DETAILED DESCRIPTION

Implementations of the disclosure will now be described, by way of embodiments only, with reference to the drawings. Obviously, the described embodiments are only a part of the embodiments of the present invention, but not all of the embodiments. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are not to be considered as limiting the scope of the embodiments.

Implementations of the disclosure will now be described, by way of embodiments only, with reference to the drawings. It should be noted that non-conflicting details and features in the embodiments of the present disclosure may be combined with each other.

Figure 1:
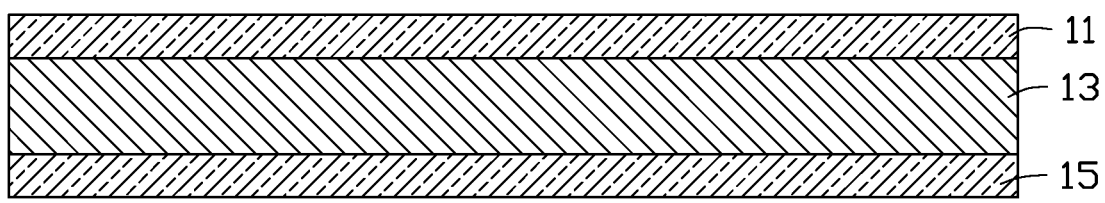
FIG. 1 is a schematic structural diagram of a composite substrate of an embodiment of the present invention.

Referring to FIG. 1 to FIG. 8, an embodiment of the present invention of a method for manufacturing a transparent circuit board includes the following steps:

Step S1, referring to FIG. 1, a composite substrate 10 is provided. The composite substrate 10 includes a first transparent insulating layer 11, a conductive layer 13, and a second transparent insulating layer 15 stacked in the order written.

In this embodiment, the first transparent insulating layer 11 and the second transparent insulating layer 15 may be respectively selected from one of a polyimide film and a polyterephthalic resin. In another embodiment, the first transparent insulating layer 11 and the second transparent insulating layer 15 may also be other transparent insulating materials.

In this embodiment, a thickness of each of the first transparent insulating layer and the second transparent insulating layer is preferably greater than 10 microns.

Preferably, the conductive layer 13 is a nickel plate. In another embodiment, the conductive layer 13 may be made of other conductive materials.

In another embodiment, the composite substrate 10 is formed by stacking the first transparent insulating layer 11 and the conductive layer 13.

Figure 2:
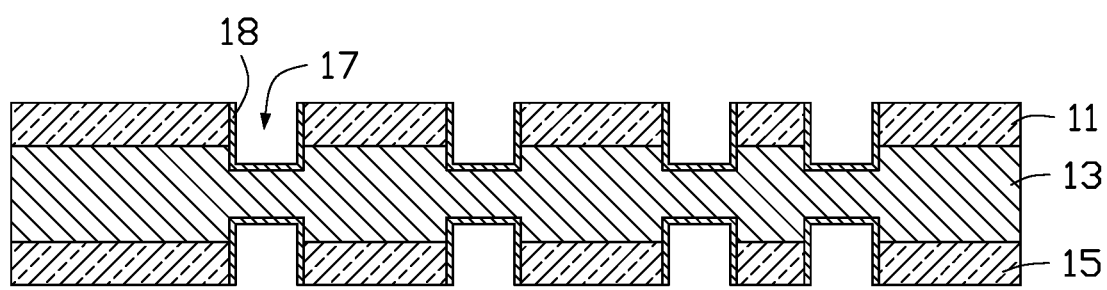
FIG. 2 is a schematic structural view of forming a wiring groove and a carbon black layer on the composite substrate shown in FIG. 1.

Step S2, referring to FIG. 2, a wiring groove 17 is respectively formed on the first transparent insulating layer 11 and the second transparent insulating layer 15 by laser ablation, and a carbon black layer 18 is formed on an inner wall of the wiring groove 17. Each wiring groove 17 penetrates the first transparent insulating layer 11 or the second transparent insulating layer 15.

The carbon black layer 18 is a carbide formed by the first transparent insulating layer 11 and the second transparent insulating layer 15 under an action of the laser.

In this embodiment, each wiring groove 17 may extend toward the conductive layer 13 to pass through a part of the conductive layer 13.

In this embodiment, preferably, an energy of the laser ablation is in a range of 4 W to 7 W, and a moving speed of the laser ablation is in a range of 150 mm/sec to 300 mm/sec.

Figure 3:
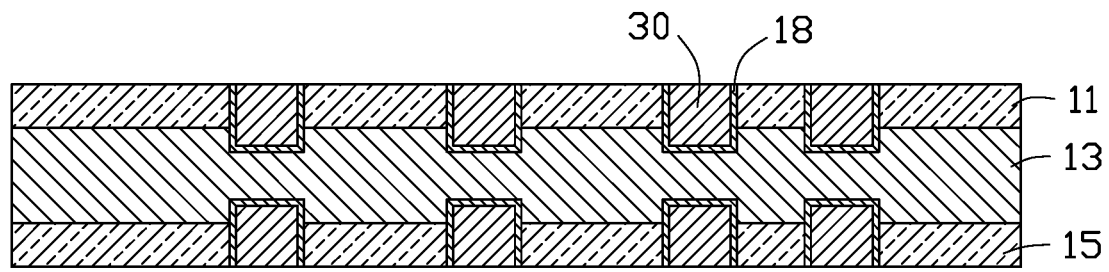
FIG. 3 is a schematic structural view of forming a conductive wiring in the wiring groove shown in FIG. 2.

Step S3, referring to FIG. 3, a conductive wiring 30 is formed corresponding to the wiring groove 17, the conductive wiring 30 fully fills the wiring groove 17.

In this embodiment, the conductive wiring 30 is formed by electroplating. In another embodiment, the conductive wiring 30 may be formed by other ways.

A surface roughness of the conductive wiring 30 is less than a surface roughness of the carbon black layer 18.

In this embodiment, preferably, a line width of the conductive wiring 30 is less than 8 µm, that is, a width of the wiring groove 17 is less than 8 µm. Preferably, a thickness of the conductive wiring 30 is greater than 10 µm.

Figure 4:
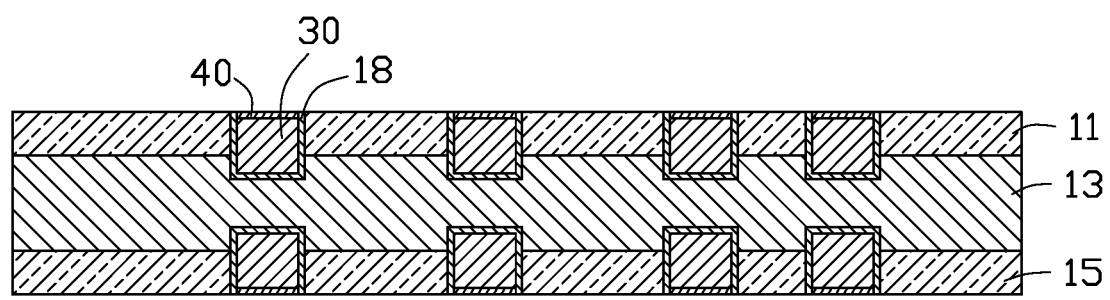
FIG. 4 is a schematic structural view of the conductive wiring shown in FIG. 3 after a black oxide treatment.

Step S4, referring to FIG. 4, a blackened layer 40 is formed by performing a black oxide treatment on a surface of the conductive wiring 30 facing away from the conductive layer 13.

A surface roughness of the blackened layer 40 is greater than the surface roughness of the carbon black layer 18.

Figure 5:
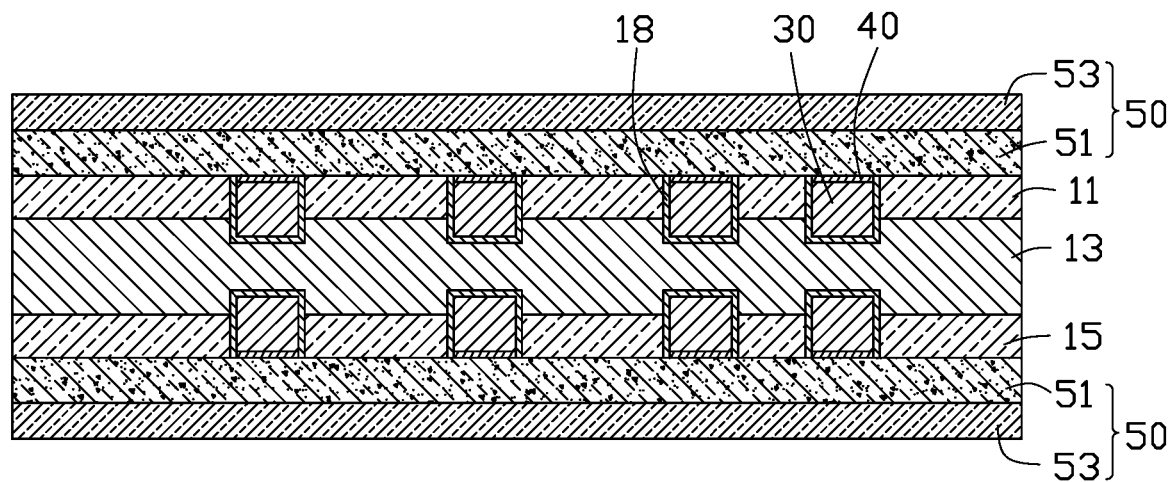
FIG. 5 is a schematic structural view of pressing cover films on the composite substrate shown in FIG. 4.

Step S5, referring to FIG. 5, a side of the first transparent insulating layer 11 facing away from the conductive layer 13 and a side of the second transparent insulating layer 15 facing away from the conductive layer 13 are respectively pressed with a transparent cover film 50.

The cover film 50 includes an adhesive layer 51 and a protective layer 53. Each adhesive layer 51 is combined with the first transparent insulating layer 11 or the second transparent insulating layer 15. The protective layer 53 is disposed on a side of the adhesive layer 51 facing away from the conductive layer 13.

Figure 6:
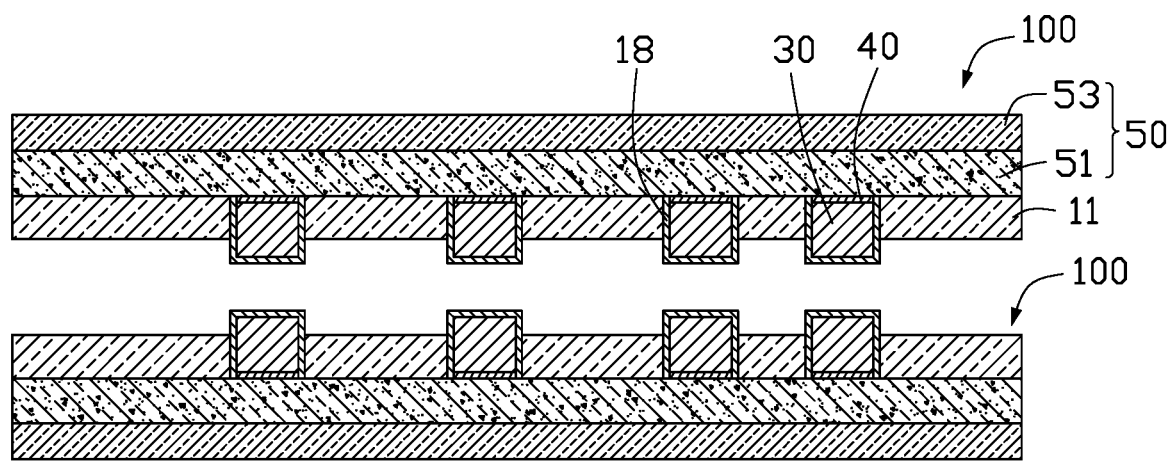
FIG. 6 is a schematic structural view of a structure after removing a conductive layer of the composite substrate shown in FIG. 5.

Step S6, referring to FIG. 6, the conductive layer 13 is removed to expose a side of the first transparent insulating layer 11 facing away from the cover film 50 and a side of the second transparent insulating layer 15 facing away from the cover film 50, thereby obtaining two transparent circuit boards 100. Each conductive wiring 30 of the transparent circuit boards 100 is at least partially embedded in the first transparent insulating layer 11 or the second transparent insulating layer 15.

Figure 7:
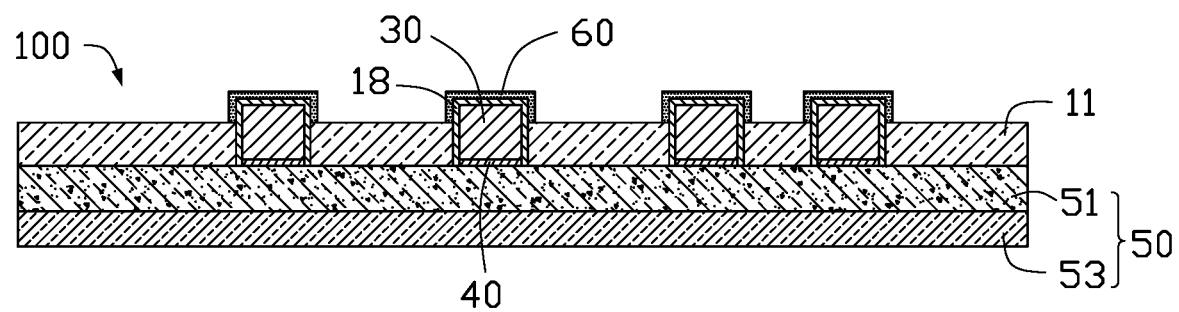
FIG. 7 is a schematic structural view of forming a gold layer on the conductive wiring shown in FIG. 6.

In this embodiment, the method for manufacturing the transparent circuit board may further include step S7 and step S8, as follows:

Step S7, referring to FIG. 7, a gold layer 60 is formed on a surface of each conductive wiring 30 exposing from the first transparent insulating layer 11 or the second transparent insulating layer 15 by Electroless Nickel/Immersion Gold. The gold layer 60 is combined with the carbon black layer 18.

Figure 8:
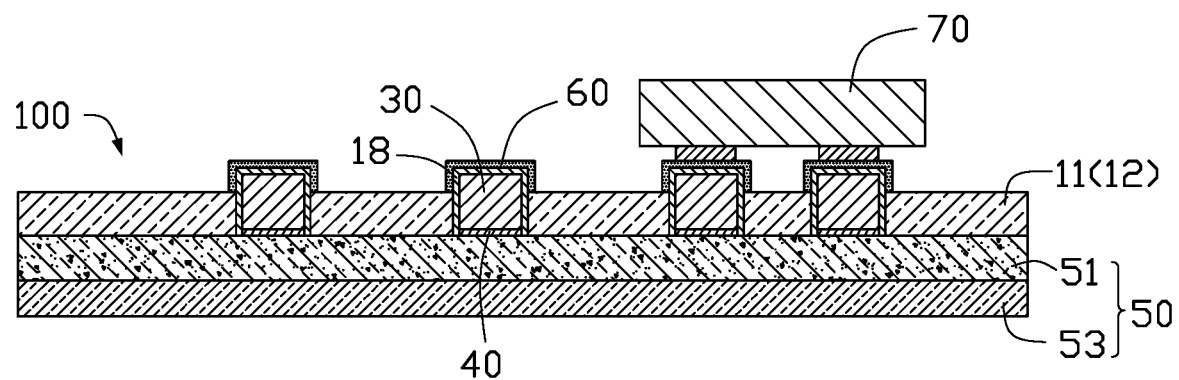
FIG. 8 is a schematic structural view of mounting an electronic component on the conductive wiring shown in FIG. 7.

Step S8, referring to FIG. 8, an electronic component 70 is mounted by a Surface Mount Technology (SMT), the electronic component 70 is combined with a side of the conductive wiring 30 facing away from the cover film 50.

Referring to FIG. 8, an embodiment of the present invention of a transparent circuit board 100 includes a conductive wiring 30, a transparent insulating layer 12 and a cover film 50. The transparent insulating layer 12 and the cover film 50 are stacked along a stacking direction. The conductive wiring 30 penetrates the transparent insulating layer 12 along the stacking direction, and is at least partially embedded in the transparent insulating layer 12. A blackened layer 40 is formed on a surface of the conductive wiring 30 combined with the cover film 50. A carbon black layer 18 is formed on a surface of the conductive wiring 30 without the blackened layer 40.

The carbon black layer 18 is a carbide formed by the transparent insulating layer 12 under an action of the laser. The blackened layer 40 is a film formed after performing a black oxide treatment on the conductive wiring 30.

In this embodiment, a surface roughness of the blackened layer 40 is greater than a surface roughness of the carbon black layer 18. The surface roughness of the carbon black layer 18 is greater than a surface roughness of the conductive wiring 30.

The transparent insulating layer 12 may be selected from one of a polyimide film and a polyterephthalic resin. In another embodiment, the transparent insulating layer 12 may also be other transparent insulating materials.

In this embodiment, the conductive wiring 30 may protrude from a side of the transparent insulating layer 12 facing away from the cover film 50.

Preferably, a line width of the conductive wiring 30 is less than 8 μm.

In this embodiment, the transparent circuit board 100 may further include a gold layer 60. The gold layer 60 covers a surface of the conductive wiring 30 exposed from the transparent insulating layer 12.

The transparent circuit board 100 may further include an electronic component 70. The electronic component 70 is combined with a side of the conductive wiring 30 facing away from the cover film 50.

The whole surface of the conductive wiring 30 of the transparent circuit board made by the present invention of the method for manufacturing the transparent circuit board 100 is covered by the carbon black layer 18 and the blackened layer 40, which reduces a reflection of light by the conductive wiring 30, so that a transparency of the transparent circuit board 100 increases. At the same time, the carbon black layer 18 and the blackened layer 40 may prevent the conductive wiring 30 from being oxidized, thereby ensuring a quality of the conductive wiring 30. Moreover, since the conductive wiring 30 is at least partially embedded in the transparent insulating layer , a line width of the conductive wiring 30 is reduced while thickening, so that a larger current may be carried without increasing an overall thickness of the transparent circuit board 100. That is, the wirings may be designed thinner, thereby further improving the transparency of the transparent circuit board 100. Further, since the surface roughness of the blackened layer 40 is relatively great, a bonding force between the blackened layer 40 and the cover film 50 is increased. Further, the use of a nickel plate as the conductive layer 13 may provide a carrier for conducting current when the conductive wiring 30 is formed by electroplating, and a surface of the nickel plate is relatively smooth, the conductive layer 13 can be easily removed, thereby improving production efficiency and product quality.

The above is only the preferred embodiment of the present invention, and does not limit the present invention in any form. Although the present invention has been disclosed as the preferred embodiment, it is not intended to limit the present invention. Any person skilled in the art , without departing from the scope of the technical solution of the present invention, when the technical contents disclosed above can be used to make some changes or modifications to equivalent equivalent implementations, if without departing from the technical solution content of the present invention, any simple modifications, equivalent changes and modifications made to the above embodiments based on the technical essence of the present invention still fall within the scope of the technical solution of the present invention.

What is claimed is:

1. A method for manufacturing a transparent circuit board, comprising:
    providing a composite substrate, the composite substrate comprising a conductive layer and a transparent insulating layer on the conductive layer;
    forming a wiring groove on the transparent insulating layer by laser ablation, and forming a carbon black layer on an inner wall of the wiring groove, wherein the wiring groove penetrates the transparent insulating layer, the wiring groove extends toward the conductive layer to pass through a part of the conductive layer;
    forming a conductive wiring corresponding to the wiring groove, the conductive wiring fully filling the wiring groove;
    performing a black oxide treatment on a surface of the conductive wiring facing away from the conductive layer to form a blackened layer;
    pressing a transparent cover film on a side of the transparent insulating layer facing away from the conductive layer; and
    removing the conductive layer.

2. The method for manufacturing the transparent circuit board of claim 1, wherein the conductive layer is a nickel plate.

3. The method for manufacturing the transparent circuit board of claim 1, wherein a surface roughness of the blackened layer is greater than a surface roughness of the carbon black layer.

4. The method for manufacturing the transparent circuit board of claim 1, wherein the composite substrate comprises two transparent insulating layers on opposite surfaces of the conductive layer.

5. The method for manufacturing the transparent circuit board of claim 1, wherein a line width of the conductive wiring is less than 8 μm, and a thickness of the conductive wiring is greater than 10 μm.

* * * * *